(12) United States Patent
Sengers et al.

(10) Patent No.: US 8,947,637 B2
(45) Date of Patent: *Feb. 3, 2015

(54) LITHOGRAPHIC APPARATUS AND DEVICE MANUFACTURING METHOD

(75) Inventors: Timotheus Franciscus Sengers, 's-Hertogenbosch (NL); Marcus Adrianus Van De Kerkhof, Helmond (NL); Mark Kroon, Utrecht (NL); Kees Van Weert, Amstelveen (NL)

(73) Assignee: ASML Netherlands B.V., Veldhoven (NL)

( * ) Notice: Subject to any disclaimer, the term of this patent is extended or adjusted under 35 U.S.C. 154(b) by 359 days.

This patent is subject to a terminal disclaimer.

(21) Appl. No.: 13/226,103

(22) Filed: Sep. 6, 2011

(65) Prior Publication Data

US 2011/0317143 A1    Dec. 29, 2011

Related U.S. Application Data

(63) Continuation of application No. 11/482,119, filed on Jul. 7, 2006, now Pat. No. 8,035,798, which is a continuation of application No. 10/924,202, filed on Aug. 24, 2004, now Pat. No. 7,907,255.

(30) Foreign Application Priority Data

Aug. 29, 2003    (EP) .................................... 03255395

(51) Int. Cl.
*G03B 27/58*    (2006.01)
*G03F 9/00*    (2006.01)
*G03F 7/20*    (2006.01)

(52) U.S. Cl.
CPC .......... *G03F 9/7088* (2013.01); *G03F 7/70341* (2013.01); *G03F 7/707* (2013.01); *G03F 7/7085* (2013.01)
USPC ......................................................... 355/72

(58) Field of Classification Search
CPC ............ G03F 7/70358; G03F 7/70341; G03F 7/7085; G03F 7/70558; G03F 7/70316
USPC .......... 355/69, 53, 67, 30; 250/548; 356/399, 356/400, 401; 385/49, 89
See application file for complete search history.

(56) References Cited

U.S. PATENT DOCUMENTS

| | | | |
|---|---|---|---|
| 3,573,975 A | 4/1971 | Dhaka et al. | 117/212 |
| 3,648,587 A | 3/1972 | Stevens | 95/44 |

(Continued)

FOREIGN PATENT DOCUMENTS

| | | |
|---|---|---|
| DE | 206 607 | 2/1984 |
| DE | 221 563 | 4/1985 |

(Continued)

OTHER PUBLICATIONS

M. Switkes et al., "Immersion Lithography at 157 nm", MIT Lincoln Lab, Orlando 2001-1, Dec. 17, 2001.

(Continued)

*Primary Examiner* — Peter B Kim
(74) *Attorney, Agent, or Firm* — Pillsbury Winthrop Shaw Pittman LLP

(57) ABSTRACT

A lithographic apparatus is provided that has a sensor at substrate level, the sensor including a radiation receiver, a transmissive plate supporting the radiation receiver, and a radiation detector, wherein the sensor is arranged to avoid loss of radiation between the radiation receiver and a final element of the radiation detector.

36 Claims, 13 Drawing Sheets

(56) References Cited

U.S. PATENT DOCUMENTS

| | | | |
|---|---|---|---|
| 4,346,164 A | 8/1982 | Tabarelli et al. | 430/311 |
| 4,390,273 A | 6/1983 | Loebach et al. | 355/125 |
| 4,396,705 A | 8/1983 | Akeyama et al. | 430/326 |
| 4,480,910 A | 11/1984 | Takanashi et al. | 355/30 |
| 4,509,852 A | 4/1985 | Tabarelli et al. | 355/30 |
| 4,540,277 A | 9/1985 | Mayer et al. | 355/53 |
| 5,040,020 A | 8/1991 | Rauschenbach et al. | 355/53 |
| 5,121,256 A | 6/1992 | Corle et al. | 359/664 |
| 5,610,683 A | 3/1997 | Takahashi | 355/53 |
| 5,715,039 A | 2/1998 | Fukuda et al. | 355/53 |
| 5,798,838 A | 8/1998 | Taniguchi et al. | |
| 5,825,043 A | 10/1998 | Suwa | 250/548 |
| 5,900,354 A | 5/1999 | Batchelder | 430/395 |
| 6,191,429 B1 | 2/2001 | Suwa | 250/548 |
| 6,236,634 B1 | 5/2001 | Lee et al. | 369/112 |
| 6,406,196 B1 | 6/2002 | Uno et al. | |
| 6,560,032 B2 | 5/2003 | Hatano | 359/656 |
| 6,563,565 B2 | 5/2003 | Nishi | |
| 6,568,594 B1 | 5/2003 | Hendriks et al. | |
| 6,600,547 B2 | 7/2003 | Watson et al. | |
| 6,603,130 B1 | 8/2003 | Bisschops et al. | 250/492.1 |
| 6,633,365 B2 | 10/2003 | Suenaga | 355/53 |
| 6,940,582 B1 | 9/2005 | Tanaka | |
| 7,199,858 B2 | 4/2007 | Lof et al. | |
| 7,359,030 B2 | 4/2008 | Simon et al. | |
| 7,907,255 B2 | 3/2011 | Sengers et al. | |
| 2002/0020821 A1 | 2/2002 | Van Santen et al. | 250/492 |
| 2002/0101574 A1 | 8/2002 | Tsuji | |
| 2002/0136144 A1 | 9/2002 | Hatano | |
| 2002/0163629 A1 | 11/2002 | Switkes et al. | 355/53 |
| 2003/0030916 A1 | 2/2003 | Suenaga | |
| 2003/0123040 A1 | 7/2003 | Almogy | 355/69 |
| 2003/0161571 A1 | 8/2003 | Davids et al. | 385/14 |
| 2003/0174408 A1 | 9/2003 | Rostalski et al. | 359/642 |
| 2004/0000627 A1 | 1/2004 | Schuster | |
| 2004/0021844 A1 | 2/2004 | Suenaga | |
| 2004/0075895 A1 | 4/2004 | Lin | 359/380 |
| 2004/0109237 A1 | 6/2004 | Epple et al. | |
| 2004/0114117 A1 | 6/2004 | Bleeker | |
| 2004/0118184 A1 | 6/2004 | Violette | |
| 2004/0119954 A1 | 6/2004 | Kawashima et al. | 355/30 |
| 2004/0125351 A1 | 7/2004 | Krautschik et al. | 355/53 |
| 2004/0136494 A1 | 7/2004 | Lof et al. | |
| 2004/0160582 A1 | 8/2004 | Lof et al. | |
| 2004/0165159 A1 | 8/2004 | Lof et al. | |
| 2004/0169834 A1 | 9/2004 | Richter et al. | |
| 2004/0169924 A1 | 9/2004 | Flagello et al. | |
| 2004/0180294 A1 | 9/2004 | Baba-Ali et al. | |
| 2004/0180299 A1 | 9/2004 | Rolland et al. | |
| 2004/0202429 A1 | 10/2004 | Margalit et al. | |
| 2004/0207824 A1 | 10/2004 | Lof et al. | |
| 2004/0211920 A1 | 10/2004 | Derksen et al. | |
| 2004/0224265 A1 | 11/2004 | Endo et al. | |
| 2004/0224525 A1 | 11/2004 | Endo et al. | |
| 2004/0227923 A1 | 11/2004 | Flagello et al. | |
| 2004/0233405 A1 | 11/2004 | Kato et al. | |
| 2004/0253547 A1 | 12/2004 | Endo et al. | |
| 2004/0253548 A1 | 12/2004 | Endo et al. | |
| 2004/0257544 A1 | 12/2004 | Vogel et al. | |
| 2004/0259008 A1 | 12/2004 | Endo et al. | |
| 2004/0259040 A1 | 12/2004 | Endo et al. | |
| 2004/0263808 A1 | 12/2004 | Sewell | |
| 2004/0263809 A1 | 12/2004 | Nakano | |
| 2005/0002004 A1 | 1/2005 | Kolesnychenko et al. | |
| 2005/0007569 A1 | 1/2005 | Streefkerk et al. | |
| 2005/0007570 A1 | 1/2005 | Streefkerk et al. | |
| 2005/0018155 A1 | 1/2005 | Cox et al. | |
| 2005/0018156 A1 | 1/2005 | Mulkens et al. | |
| 2005/0024609 A1 | 2/2005 | De Smit et al. | |
| 2005/0030497 A1 | 2/2005 | Nakamura | |
| 2005/0030498 A1 | 2/2005 | Mulkens | |
| 2005/0030506 A1 | 2/2005 | Schuster | |
| 2005/0030511 A1 | 2/2005 | Auer-Jongepier et al. | |
| 2005/0036121 A1 | 2/2005 | Hoogendam | |
| 2005/0036183 A1 | 2/2005 | Yeo et al. | |
| 2005/0036184 A1 | 2/2005 | Yeo et al. | |
| 2005/0036213 A1 | 2/2005 | Mann et al. | |
| 2005/0037269 A1 | 2/2005 | Levinson | |
| 2005/0041225 A1 | 2/2005 | Sengers et al. | |
| 2005/0042554 A1 | 2/2005 | Dierichs et al. | |
| 2005/0046813 A1 | 3/2005 | Streefkerk et al. | |
| 2005/0046934 A1 | 3/2005 | Ho et al. | |
| 2005/0048220 A1 | 3/2005 | Mertens et al. | |
| 2005/0048223 A1 | 3/2005 | Pawloski et al. | |
| 2005/0052632 A1 | 3/2005 | Miyajima | |
| 2005/0068639 A1 | 3/2005 | Pierrat et al. | |
| 2005/0073670 A1 | 4/2005 | Carroll | |
| 2005/0078286 A1 | 4/2005 | Dierichs et al. | |
| 2005/0084794 A1 | 4/2005 | Meagley et al. | |
| 2005/0088635 A1 | 4/2005 | Hoogendam et al. | |
| 2005/0094114 A1 | 5/2005 | Streefkerk et al. | |
| 2005/0094116 A1 | 5/2005 | Flagello et al. | |
| 2005/0094119 A1 | 5/2005 | Loopstra et al. | |
| 2005/0100745 A1 | 5/2005 | Lin et al. | |
| 2005/0110973 A1 | 5/2005 | Streefkerk et al. | |
| 2005/0117224 A1 | 6/2005 | Shafer et al. | |
| 2005/0122497 A1 | 6/2005 | Lyons et al. | |
| 2005/0132914 A1 | 6/2005 | Mulkens et al. | |
| 2005/0134815 A1 | 6/2005 | Van Santen et al. | |
| 2005/0134817 A1 | 6/2005 | Nakamura | |
| 2005/0141098 A1 | 6/2005 | Schuster | |
| 2005/0145265 A1 | 7/2005 | Ravkin et al. | |
| 2005/0145803 A1 | 7/2005 | Hakey et al. | |
| 2005/0146693 A1 | 7/2005 | Ohsaki | |
| 2005/0146694 A1 | 7/2005 | Tokita | |
| 2005/0146695 A1 | 7/2005 | Kawakami | |
| 2005/0147920 A1 | 7/2005 | Lin et al. | |
| 2005/0153424 A1 | 7/2005 | Coon | |
| 2005/0158673 A1 | 7/2005 | Hakey et al. | |
| 2005/0164502 A1 | 7/2005 | Deng et al. | |
| 2005/0174549 A1 | 8/2005 | Duineveld et al. | |
| 2005/0175940 A1 | 8/2005 | Dierichs | |
| 2005/0185269 A1 | 8/2005 | Epple et al. | |
| 2005/0190435 A1 | 9/2005 | Shafer et al. | |
| 2005/0190455 A1 | 9/2005 | Rostalski et al. | |
| 2005/0205108 A1 | 9/2005 | Chang et al. | |
| 2005/0213061 A1 | 9/2005 | Hakey et al. | |
| 2005/0213072 A1 | 9/2005 | Schenker et al. | |
| 2005/0217135 A1 | 10/2005 | O'Donnell et al. | |
| 2005/0217137 A1 | 10/2005 | Smith et al. | |
| 2005/0217703 A1 | 10/2005 | O'Donnell | |
| 2005/0219481 A1 | 10/2005 | Cox et al. | |
| 2005/0219482 A1 | 10/2005 | Baselmans et al. | |
| 2005/0219499 A1 | 10/2005 | Maria Zaal | |
| 2005/0225737 A1 | 10/2005 | Weissenrieder et al. | |
| 2005/0231694 A1 | 10/2005 | Kolesnychenko et al. | |
| 2005/0233081 A1 | 10/2005 | Tokita | |
| 2005/0237501 A1 | 10/2005 | Furukawa et al. | |
| 2005/0243292 A1 | 11/2005 | Baselmans et al. | |
| 2005/0245005 A1 | 11/2005 | Benson | |
| 2005/0253090 A1 | 11/2005 | Gau et al. | |
| 2005/0259232 A1 | 11/2005 | Streefkerk et al. | |
| 2005/0259233 A1 | 11/2005 | Streefkerk et al. | |
| 2005/0259236 A1 | 11/2005 | Straaijer | |
| 2005/0264778 A1 | 12/2005 | Lof et al. | |
| 2005/0270505 A1 | 12/2005 | Smith | |
| 2006/0181690 A1 | 8/2006 | Nishinaga et al. | |
| 2007/0064210 A1 | 3/2007 | Kobayashi et al. | |

FOREIGN PATENT DOCUMENTS

| | | |
|---|---|---|
| DE | 224448 | 7/1985 |
| DE | 242880 | 2/1987 |
| EP | 0023231 | 2/1981 |
| EP | 0418427 | 3/1991 |
| EP | 0 445 871 A1 | 9/1991 |
| EP | 1039511 | 9/2000 |
| EP | 1 182 511 A1 | 2/2002 |
| EP | 1 184 727 A1 | 3/2002 |
| FR | 2474708 | 7/1981 |
| JP | A 57-153433 | 9/1982 |
| JP | 58-202448 | 11/1983 |
| JP | A-58-202448 | 11/1983 |
| JP | A 59-19912 | 2/1984 |

(56) References Cited

FOREIGN PATENT DOCUMENTS

| | | |
|---|---|---|
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | A 05-62877 | 3/1993 |
| JP | 06-124873 | 5/1994 |
| JP | 07-132262 | 5/1995 |
| JP | 07-220990 | 8/1995 |
| JP | A 08-316125 | 11/1996 |
| JP | A-8-316133 | 11/1996 |
| JP | 10-228661 | 8/1998 |
| JP | 10-255319 | 9/1998 |
| JP | 10-284414 | 10/1998 |
| JP | 10-303114 | 11/1998 |
| JP | 10-340846 | 12/1998 |
| JP | 11-176727 | 7/1999 |
| JP | A-11-176727 | 7/1999 |
| JP | 2000-058436 | 2/2000 |
| JP | A-2000-58436 | 2/2000 |
| JP | 2001-091849 | 4/2001 |
| JP | 2002-170754 | 6/2002 |
| JP | 2004-193252 | 7/2004 |
| JP | 2004-251764 | 9/2004 |
| JP | A-2004-301825 | 10/2004 |
| JP | A-2005-93948 | 4/2005 |
| WO | 99/00689 | 1/1999 |
| WO | WO 99/49504 | 9/1999 |
| WO | WO 01/08205 A1 | 1/2001 |
| WO | WO 02/091078 A1 | 11/2002 |
| WO | WO 03/077036 | 9/2003 |
| WO | WO 03/077037 | 9/2003 |
| WO | WO 2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2005/001432 A2 | 1/2005 |
| WO | WO 2005/001572 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/050324 A2 | 6/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |
| WO | WO 2005/059654 A1 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/081030 A1 | 9/2005 |
| WO | WO 2005/081067 A1 | 9/2005 |
| WO | WO 2005/098504 A1 | 10/2005 |
| WO | WO 2005/098505 A1 | 10/2005 |
| WO | WO 2005/098506 A1 | 10/2005 |
| WO | WO 2005/106589 A1 | 11/2005 |
| WO | WO 2005/111689 A2 | 11/2005 |
| WO | WO 2005/111722 A2 | 11/2005 |
| WO | WO 2005/119368 A2 | 12/2005 |
| WO | WO 2005/119369 A1 | 12/2005 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.
M. Switkes et al., "Immersion Lithography: Optics for the 50 nm Node", 157 Anvers-1, Sep. 4, 2002.
B.J. Lin, "Drivers, Prospects and Challenges for Immersion Lithography", TSMC, Inc., Sep. 2002.
B.J. Lin, "Proximity Printing Through Liquid", IBM Technical Disclosure Bulletin, vol. 20, No. 11B, Apr. 1978, p. 4997.
B.J. Lin, "The Paths to Subhalf-Micrometer Optical Lithography", SPIE vol. 922, Optical/Laser Microlithography (1988), pp. 256-269.
G.W.W. Stevens, "Reduction of Waste Resulting from Mask Defects", Solid State Technology, Aug. 1978, vol. 21 008, pp. 68-72.
S. Owa et al., "Immersion Lithography; its potential performance and issues", SPIE Microlithography 2003, 5040-186, Feb. 27, 2003.
S. Owa et al., "Advantage and Feasibility of Immersion Lithography", Proc. SPIE 5040 (2003).
Nikon Precision Europe GmbH, "Investor Relations—Nikon's Real Solutions", May 15, 2003.
H. Kawata et al., "Optical Projection Lithography using Lenses with Numerical Apertures Greater than Unity", Microelectronic Engineering 9 (1989), pp. 31-36.
J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.
B.W. Smith et al., "Immersion Optical Lithography at 193nm", Future Fab International, vol. 15, Jul. 11, 2003.
H. Kawata et al., "Fabrication of 0.2μm Fine Patterns Using Optical Projection Lithography with an Oil Immersion Lens", Jpn. J. Appl. Phys. vol. 31 (1992), pp. 4174-4177.
G. Owen et al., "1/8μm Optical Lithography", J. Vac. Sci. Technol. B., vol. 10, No. 6, Nov./Dec. 1992, pp. 3032-3036.
H. Hogan, "New Semiconductor Lithography Makes a Splash", Photonics Spectra, Photonics TechnologyWorld, Oct. 2003 Edition, pp. 1-3.
S. Owa and N. Nagasaka, "Potential Performance and Feasibility of Immersion Lithography", NGL Workshop 2003, Jul. 10, 2003, Slide Nos. 1-33.
S. Owa et al., "Update on 193nm immersion exposure tool", Litho Forum, International SEMATECH, Los Angeles, Jan. 27-29, 2004, Slide Nos. 1-51.
H. Hata, "The Development of Immersion Exposure Tools", Litho Forum, International SEMATCH, Los Angeles, Jan. 27-29, 2004, Slide Nos. 1-22.
T. Matsuyama et al., "Nikon Projection Lens Update", SPIE Microlithography 2004, 5377-65, Mar., 2004.
"Depth-of-Focus Enhancement Using High Refractive Index Layer on the Imaging Layer", IBM Technical Disclosure Bulletin, vol. 27, No. 11, Apr. 1985, p. 6521.

(56) References Cited

OTHER PUBLICATIONS

A. Suzuki, "Lithography Advances on Multiple Fronts", EEdesign, EE Times, Jan. 5, 2004.

B. Lin, The $k_3$ coefficient in nonparaxial λ/NA scaling equations for resolution, depth of focus, and immersion lithography, *J. Microlith., Microfab., Microsyst.* 1(1):7-12 (2002).

Search Report for European Application No. EP 04254910.5, dated Nov. 17, 2004.

European Search Report for Application No. 03255395.0, dated Aug. 19, 2004.

Japanese Patent Office Action for Japan Patent Application No. 2004-247643, dated Sep. 18, 2007.

Information Disclosure Statement for U.S. Appl. No. 11/403,922, dated Apr. 14, 2006.

Emerging Lithographic Technologies VI, Proceedings of SPIE, vol. 4688 (2002), "Semiconductor Foundry, Lithography, and Partners", B.J. Lin, pp. 11-24.

Optical Microlithography XV, Proceedings of SPIE, vol. 4691 (2002), "Resolution Enhancement of 157 nm Lithography by Liquid Immersion", M. Switkes et al., pp. 459-465.

J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.

Optical Microlithography XVI, Proceedings of SPIE vol. 5040 (2003), "Immersion lithography; its potential performance and issues", Soichi Owa et al., pp. 724-733.

JP 2004251764 A English Abstract (Sep. 2004).

Non-final Office Action as issued for U.S. Appl. No. 11/403,922, dated Apr. 30, 2008.

Final Office Action as issued for U.S. Appl. No. 11/403,922, dated Feb. 2, 2009.

Advisory Action as issued for U.S. Appl. No. 11/403,922, dated May 20, 2009.

Non-final Office Action as issued for U.S. Appl. No. 11/403,922, dated Jun. 10, 2009.

Final Office Action as issued for U.S. Appl. No. 11/403,922, dated Dec. 2, 2009.

TIS ADC

PRIOR ART

TIS ADC

US 8,947,637 B2

LITHOGRAPHIC APPARATUS AND DEVICE MANUFACTURING METHOD

This application is a continuation of U.S. patent application Ser. No. 11/482,119, filed Jul. 7, 2006, now allowed, which is a continuation of U.S. patent application Ser. No. 10/924,202, filed Aug. 24, 2004, now U.S. Pat. No. 7,907,255, which claims priority from European patent application EP 03255395.0, filed Aug. 29, 2003, each of the foregoing applications incorporated herein in its entirety by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

A number of sensors are typically used at substrate level for evaluating and optimizing imaging performance. These may include a transmission image sensor (TIS), a spot sensor for measuring exposure radiation dose and an integrated lens interferometer at scanner (ILIAS). The TIS and ILIAS are described below.

A TIS is a sensor that is used to measure the position at substrate level of a projected aerial image of a mark pattern at the mask (reticle) level. The projected image at substrate level may be a line pattern with a line width comparable to the wavelength of the exposure radiation. The TIS measures these mask patterns using a transmission pattern with a photocell underneath it. The sensor data may be used to measure the position of the mask with respect to the substrate table in six degrees of freedom (three in translation and three in rotation). In addition, the magnification and scaling of the projected mask may be measured. Since the sensor is typically capable of measuring the pattern positions and influences of all illumination settings (sigma, lens NA, all masks (binary, PSM, etc.)) a small line width is preferable. The TIS may also be used to measure the optical performance of the lithographic apparatus. Different illumination settings are used in combination with different projected images for measuring properties such as pupil shape, coma, spherical aberration, astigmatism and field curvature.

An ILIAS is an interferometric wavefront measurement system that may perform static measurements on lens aberrations up to a high order. It may be implemented as an integrated measurement system used for system initialization and calibration. Alternatively, it may be used for monitoring and recalibration "on-demand".

SUMMARY

In systems with high NA and in particular in liquid immersion systems, conventional sensors at substrate level may suffer poor sensitivity.

Accordingly, it would be advantageous, for example, to provide a sensor at substrate level with high sensitivity and which is suitable for use in a high NA system.

According to an aspect of the invention, there is provided a lithographic apparatus, comprising:

an illumination system configured to condition a radiation beam;

a support constructed to hold a patterning device, the patterning device being capable of imparting the radiation beam with a pattern in its cross-section to form a patterned radiation beam;

a substrate table constructed to hold a substrate;

a projection system configured to project the patterned radiation beam onto a target portion of the substrate; and a sensor at substrate level comprising a radiation receiver, a transmissive plate supporting the radiation receiver, and a radiation detector, the sensor being arranged to avoid loss of radiation between the radiation receiver and a final element of the radiation detector.

According to a further aspect of the invention, there is provided a device manufacturing method, comprising:

projecting a patterned beam of radiation onto a target portion of a substrate; and projecting a beam of radiation onto a sensor at substrate level that receives the beam of radiation via a radiation receiver and detects the beam of radiation via a radiation detector, the sensor being arranged to avoid loss of radiation between the radiation receiver and the final element of the radiation detector.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
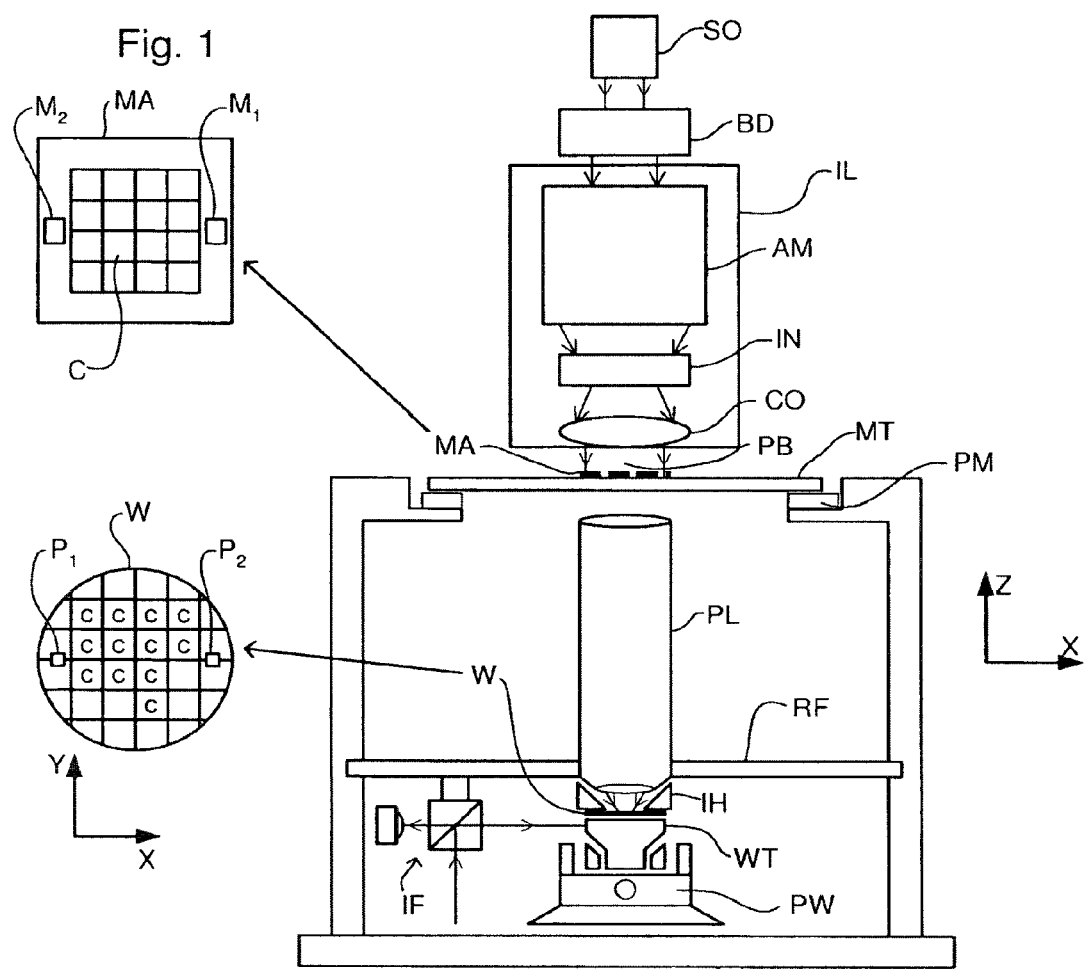
FIG. 1 depicts a lithographic apparatus according to an embodiment of the invention.
Figure 2:
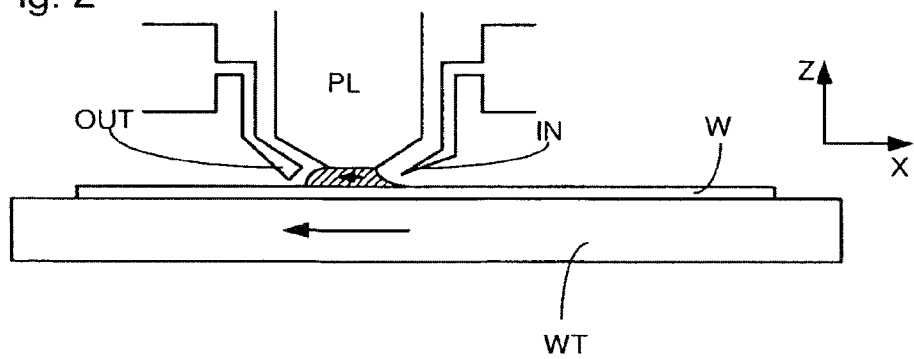
FIGS. 2 and 3 depict a liquid supply system for use in a lithographic projection apparatus.
Figure 3:
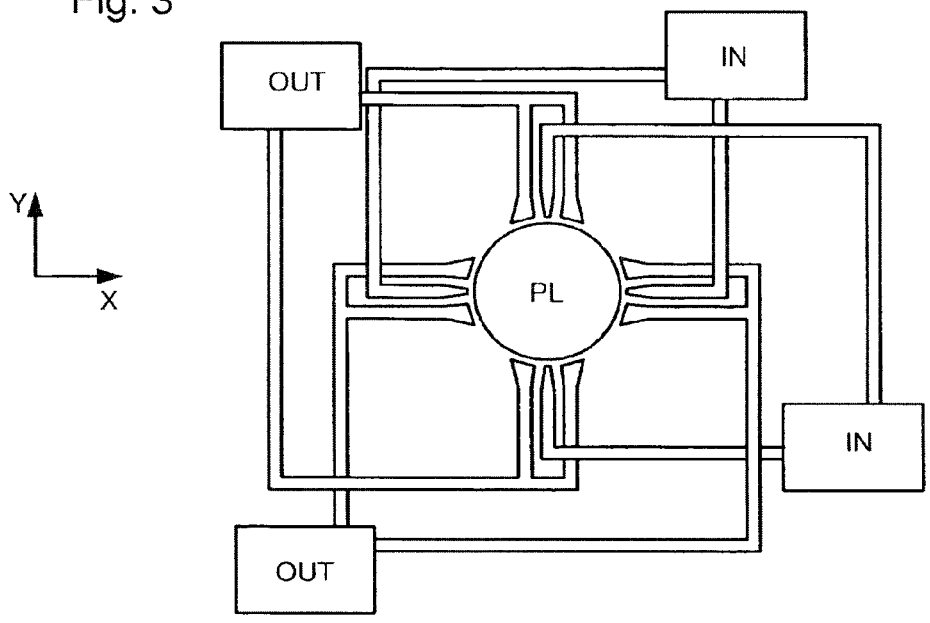

FIG. 1 schematically depicts a lithographic apparatus according to an embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam PB by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions.

The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam PB is incident on the patterning device (e.g., mask MA), which is held on the support structure (e.g., mask table MT), and is patterned by the patterning device. Having traversed the mask MA, the radiation beam PB passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam PB. Similarly, the first positioner PM and another position sensor (which is not explicitly depicted in FIG. 1) can be used to accurately position the mask MA with respect to the path of the radiation beam PB, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

FIGS. 5 to 18 depict improved substrate-level sensors according to embodiments of the invention. These sensors comprise a radiation receiver (2,18) and a radiation detector (8,24,40). In an embodiment, exposure radiation is directed from the final element of the projection system PL through an immersion liquid 1 at least partly filling a space between the final element of the projection system PL and the substrate W. The detailed configuration of each of these elements depends on the properties of the radiation to be detected. The sensor at substrate level may comprise a photocell only, for use in cases where it is desirable for the photocell to receive the radiation directly. Alternatively, the sensor at substrate level may comprise a luminescence layer in combination with a photocell. In this arrangement, radiation at a first wavelength is absorbed by the luminescence layer and reradiated a short time later at a second (longer) wavelength. This arrangement is useful, for example, where the photocell is designed to work more efficiently at the second wavelength.

The radiation receiver (2,18), which may be a layer with a pinhole, a grating or another diffractive element fulfilling a similar function, may be supported on top of a quartz sensor body 20, i.e. on the same side of the body as the projection system. The radiation detector (8,24,40), in contrast, may be arranged within the sensor body 20, or within a concave region formed on the side of the sensor body 20 facing away from the projection system.

At boundaries between media of different refractive indices, a proportion of incident radiation will be reflected and potentially lost from the sensor. For optically smooth surfaces, the extent to which this occurs depends on the angle of incidence of the radiation and the difference in refractive index of the media in question. For radiation incident at and above a "critical angle" (conventionally measured from normal incidence) total internal reflection may occur, leading to serious loss of signal to later elements of the sensor. This may be a particular problem in high NA systems where radiation may have a higher average angle of incidence. In an embodiment of the present invention, an arrangement is provided whereby gas (e.g., air) is excluded from the region between the radiation receiver (2,18) and the radiation detector (8,24, 40) in order to avoid interfaces between media of high refractive index and the gas.

In addition to losses due to partial and total internal reflection, absorption may also seriously reduce the intensity of radiation reaching the photocell, as may scattering from interfaces that are not optically smooth.

A substantial contribution to reduced sensitivity of a sensor may include loss of radiation from the sensor before it even reaches the final element of the radiation detector. As discussed above, radiation may be lost due to scattering from rough surfaces or via total or partial internal reflection at interfaces within the detector. Alternatively, gas gaps containing oxygen and water may lead to substantial absorption of radiation passing therethrough.

Figure 5:
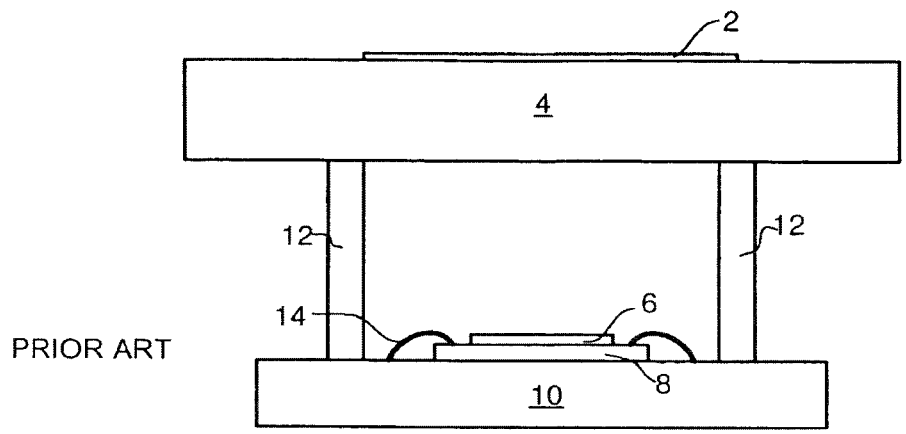
FIG. 5 depicts an ILIAS sensor module according to the prior art.

For example, FIG. 5 shows an ILIAS sensor module according to the prior art. This module has a shearing grating structure 2 as radiation receiver, supported by a transmissive plate 4, which may be made of glass or quartz. A quantum conversion layer 6 is positioned immediately above a camera chip 8 (the radiation detector), which is in turn mounted on a substrate 10. The substrate 10 is connected to the transmissive plate 4 via spacers 12 and bonding wires 14 connect the radiation detector to external instrumentation. An gas gap is located between the quantum conversion layer 6 and the transmissive plate 4. In a setup such as this designed for 157 nm radiation, for example, the gas gap within the sensor cannot easily be purged so that it may contain significant proportions of oxygen and water, which absorb radiation. Signal is therefore lost and the effect becomes worse for larger angles as these have a longer path length through the gas. Thus, the dynamic range requirements for the sensor become more severe.

According to an aspect of the invention, the sensor at substrate level may comprise one or more transmissive filler sheets. These sheets may be positioned within the sensor so as to remove a gas gap between the radiation receiver (2,18) and the final element of the radiation detector (8,24,40). Alternatively or additionally, the transmissive plate may be arranged to extend continuously between the radiation receiver (2,18) and the radiation detector (8,24,40), thus avoiding any gas gap in this region. This approach may reduce the need for additional filler sheets and associated interfaces.

Figure 6:
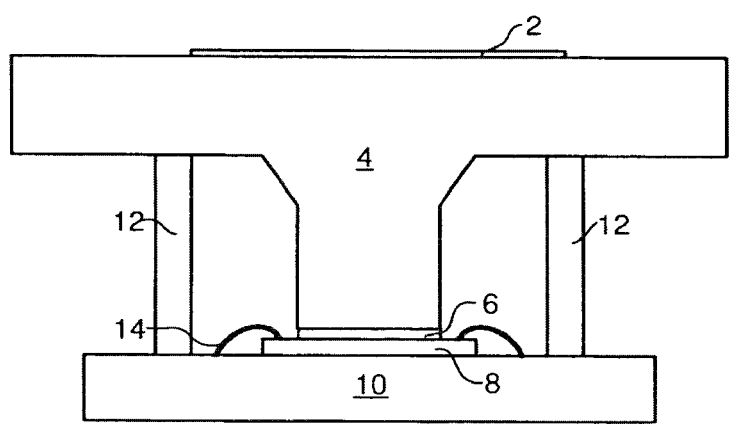
FIG. 6 depicts an ILIAS sensor module with an elongated transmissive plate according to an embodiment of the present invention.
Figure 7:
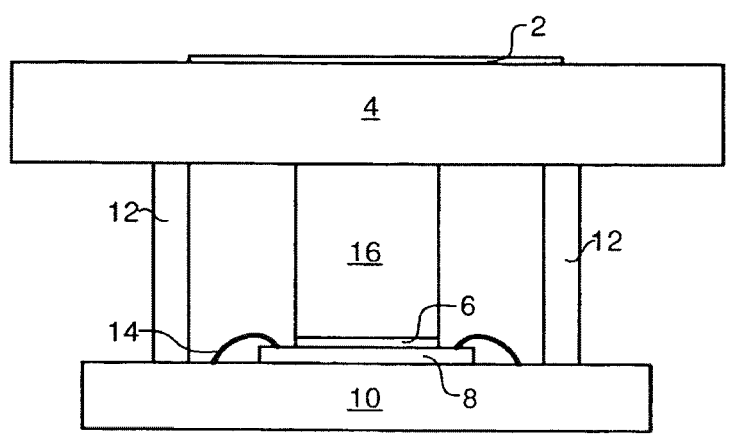
FIG. 7 depicts an ILIAS sensor module with a filler sheet according to an embodiment of the present invention.

For example, FIGS. 6 and 7 show improved ILIAS sensor modules according to embodiments of the invention. In FIG. 6, the gas gap has been removed by changing the shape of the transmissive plate 4 to fit directly to the radiation detector 8. This arrangement is made more difficult by the need to provide access for the bonding wires 14 and necessitates an elongated form. From an engineering point of view, the alternative arrangement using one or more transmissive filler sheets shown in FIG. 7 is easier to realize. Here, a filler sheet 16 of the same material as the transmissive plate 4, or of similar optical properties, is inserted between the transmissive plate 4 and the quantum conversion layer 6. The removal of the gas gap reduces transmission losses and relaxes dynamic range requirements (or, alternatively speaking, improves the effective dynamic range). Both arrangements improve refractive index matching and reduce the extent of spurious internal reflections at the interface with the transmissive plate 4.

The material for each filler sheet may be chosen to be highly transmissive for the predominant wavelength of radiation that will pass through it. Immediately following the radiation receiver (2,18) the radiation wavelength may be extremely short (e.g. 157 nm), but luminescence layers (22) occurring later in the sensor may emit longer wavelength radiation in which case it would be advantageous to choose different materials for filler sheets in the respective regions.

The material for each filler sheet may further be chosen to provide refractive index matching with media with which it is in contact. For example, the refractive index of air is very different from typical sensor components leading to strong partial reflection and a smaller critical angle for total internal reflection. By providing a filler sheet with a refractive index closer to the component in question instead of a gas gap, partial reflection is reduced and the critical angle for total internal reflection is increased. This feature has the effect of further improving the effective dynamic range of the sensor.

The filler sheet(s) may be positioned in contact with optically rough component interfaces and treated so as to follow the contours of the surface roughness. Where sensor elements have been machined they will normally have a surface roughness on the length scale of incident radiation. When a significant refractive index mismatch is present at such a surface, a significant proportion of the incident radiation will inevitably be lost due to scattering at the surface. By using a filler sheet(s) and treating it so that it follows the contours of the surface roughness (and thereby purge any gas that may exist there) the smaller discontinuity in refractive index reduces the extent of radiation loss at the interface.

Figure 8A:
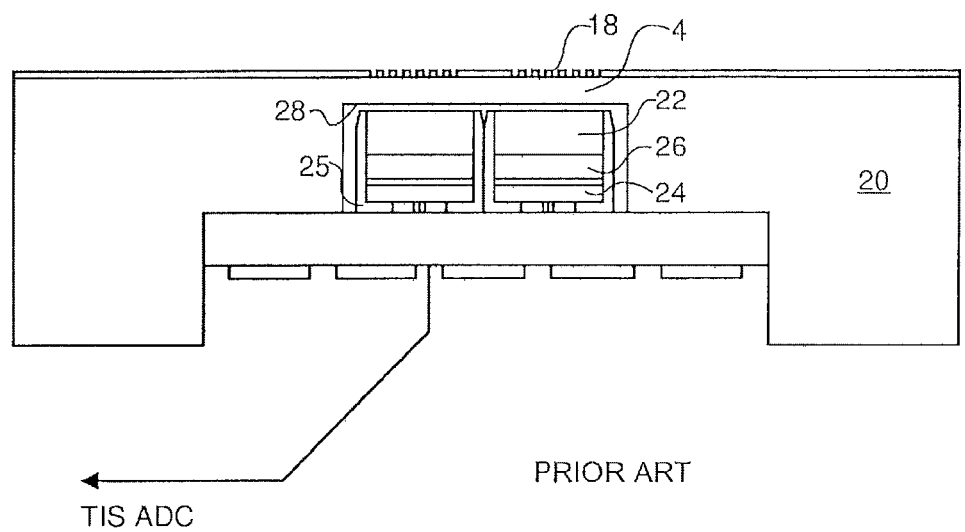
FIGS. 8a and 8b depict a luminescence based DUV TIS according to the prior art.
Figure 8B:
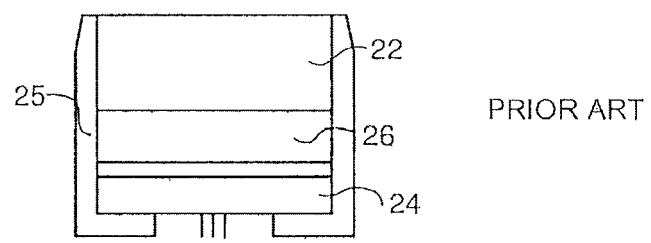

FIG. 8a shows a DUV transmission image sensor according to the prior art. FIG. 8b shows a magnified view of the processing element for clarity. The pattern of transmissive grooves 18, constituting the radiation receiver in this case, is realized by means of e-beam lithography and dry etching techniques in a thin metal layer deposited on a substrate by means of sputtering. Any DUV light that is projected towards the grooves 18 is transmitted by the transmissive plate 4 (which may be quartz or fused silica) and hits the underlying luminescent material 22, or "phosphor". The luminescent material 22 may consist of a slab of crystalline material that is doped with rare-earth ions, e.g. yttrium-aluminum-garnet doped with cerium (YAG:Ce). The main purpose of the luminescent material 22 is to convert the DUV radiation into more easily detectable visible radiation, which is then detected by the photodiode 24. DUV radiation that has not been absorbed and converted into visible radiation by the phosphor 22 may be filtered out before it reaches the photodiode 24 by a filter 26, e.g. a BG-39 or UG filter.

In the above arrangement, gas may be present in the gaps between components mounted in the sensor housing 25, yielding a number of gas/material/gas interfaces that interrupt the propagation of radiation. By considering the path of DUV radiation and radiation arising from luminescence, it is possible to identify regions where radiation is likely to be lost. The first region of interest is the rear-side 28 of the transmissive plate 4, reached by DUV radiation after it has passed through the grooves 18 and transmissive plate 4. Here, the surface has been formed by mechanical means, such as by drilling, and is inevitably rough on the scale of the wavelength of the radiation. Radiation may therefore be lost due to scattering, either back into the transmissive plate 4 or out past the luminescent material 22. Secondly, after this interface, the DUV light encounters the optically smooth gas/YAG:Ce interface, where a substantial amount of reflection may occur due to the refractive index mismatch, particularly in systems of high NA. Thirdly, the luminescent material 22 emits radiation in random directions. Due to its relatively high refractive index, the critical angle for total internal reflection at the YAG:Ce/air boundary is around 33° (where there is air in the gap between the YAG:Ce and the filter) from the normal, meaning that a large proportion of radiation incident on the boundary is reflected out of the system and lost through the side walls of the luminescent material 22. Finally, the part of the luminescence that is directed towards the photodiode has to overcome the gas/quartz interface on the diode surface where surface roughness may again account for loss of detected signal.

Figure 9:
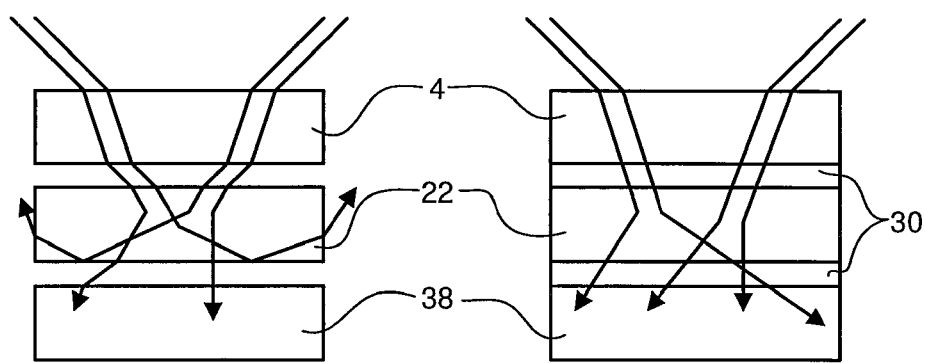
FIG. 9 depicts schematically an arrangement of filler sheets in a stack comprising transmissive plate, luminescence layer and photodiode according to an embodiment of the present invention, along with example ray paths.
Figure 10:
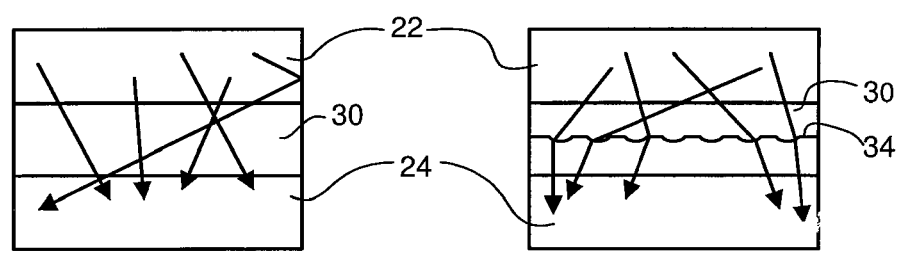
FIG. 10 depicts schematically two arrangements of a filler sheet sandwiched between a luminescence layer and photodiode according to an embodiment of the present invention, along with example ray paths.

FIGS. 9 and 10 illustrate schematic arrangements that address the problems described above as well as exemplary radiation ray paths. One or more filler sheets 30, which may be made from light transmitting plastics, are inserted between components to reduce the effect of radiation scattering at gas/material interfaces with high surface roughness or large refractive index discontinuities. For example, the filler sheet(s) 30 may be arranged to be transmissive for either DUV radiation, visible radiation, or both. Additionally, the refractive index of each filler sheet 30 may be tuned to provide the most efficient refractive index matching between media with which it is in contact. Where a filler sheet 30 is in contact with an optically rough surface, some deformation of the filler sheet 30 may be necessary to ensure that it closely follows the surface roughness and does not leave any tiny gas pockets. This may be achieved by mechanically compressing the filler sheet 30 onto the surface in question. Alternatively or additionally, the filler sheet 30 may be gently heated (avoiding excessive oxidation or other chemical decomposition that may occur at high temperature) until it flows sufficiently to follow the surface roughness. It is also possible to use a fluid as a filler sheet, chosen to have as high a refractive index as possible, for example Fomblin perfluorinated polyether.

The filler sheet(s) may be arranged to have a refractive index equal to or greater than the refractive index of the immersion liquid. In the typical case where the relevant interfaces (immersion liquid to transmissive plate and transmissive plate to filler sheet) are parallel to each other and perpendicular to the axis of the projection system, this condition ensures that no internal reflection will occur at the transmissive plate to filler sheet interface. If it were required to make these interfaces non-parallel then a corresponding increase in the lower refractive index bound for the filler sheet 30 may be chosen.

FIG. 9 shows a possible implementation of the filler sheet(s) 30 in a DUV sensor comprising a transmissive plate 4, luminescence layer 22 and photodiode 38. The right-hand diagram comprises filler sheets 30 while, for comparison, the left-hand diagram does not. In each case, arrows show exemplary ray paths through the stack, with internal reflection occurring at the YAG:Ce/diode interface when the filler sheets are absent.

The filler sheet 30 may either consist of a single sheet, as shown in the left-hand diagram of FIG. 10, for example, or of a composite sheet consisting of two or more layers of different refractive index with a micro-lens array pattern 34 formed at the boundary between the two layers.

According to this embodiment, the filler sheet not only acts to improve refractive index matching and reduce absorption but focuses rays so as to reduce their angle to the normal and thereby improve transmission at later interfaces.

One or more of the optical components (e.g. transmissive plate, filler sheet and/or luminescence layer) of the sensor at substrate level may comprise an internal-reflection-enhancing layer on its outer lateral surface. This layer may be constructed by roughening the outer surface and/or applying a metallic layer to it. This feature acts to reflect radiation back into the sensor that would otherwise have been lost.

Figure 11A:
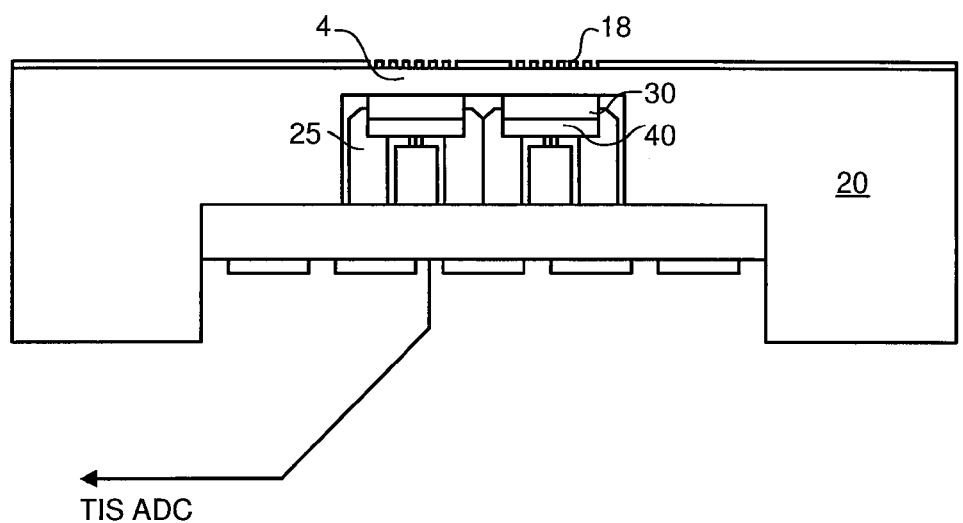
FIGS. 11a and 11b depict a non-luminescence based DUV TIS with a filler sheet according to an embodiment of the present invention.
Figure 11B:
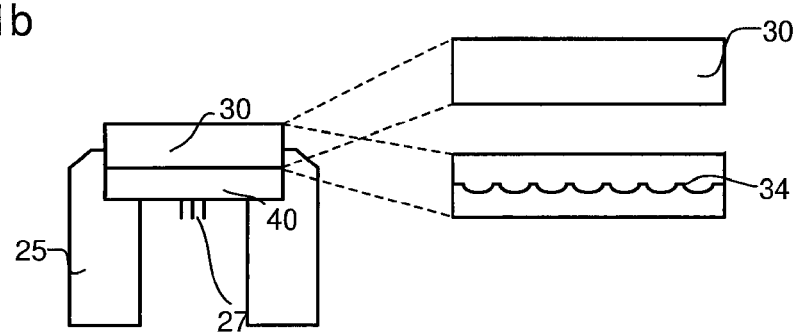

The measures discussed above significantly improve the signal-to-noise performance of TIS type sensors, a factor likely to become increasingly critical due to the trend towards designs with ever decreasing line widths of the grooves 18 in the radiation receiver. In addition to the losses associated with internal sensor interfaces, a large proportion of the signal may also be lost due to inefficient conversion of the DUV radiation to visible radiation within the luminescence layer 22. According to a further embodiment of the invention, the luminescence layer 22 is removed from the sensor and DUV radiation is arranged to impinge directly onto a suitably adapted photodiode 40. Photodiodes provide a shorter path from photon to electron (i.e. from radiation to signal) and diodes sensitive to DUV may be obtained with arbitrary shape and size. Such diodes 40 may be capable of detecting DUV radiation down to 50 nm wavelength with a conversion efficiency of the order of 0.20 A/W. Long diode lifetimes are achieved by depositing oxy-nitride passivation layers on the diode entrance windows. The arrangement is illustrated schematically in FIG. 11a. FIG. 11b shows a magnified view of the processing element for clarity. Here, photodiodes 40 are positioned below the grooves 18 in such a way that incident radiation only has to propagate through the grooves 18, a transmissive plate 4, and a refractive index matching filler sheet 30 (FIG. 11b shows two possible variations on the filler sheet, a homogeneous layer (top) and a dual layer with micro-lens patterning (bottom)) in order to reach the photodiode 40. For the refractive index matching filler sheet 30, a liquid dielectric resist HSQ may be used based on its quartz-like properties after moderate temperature curing. This may provide an optimal refractive index match. The diodes may be electronically monitored via the rear connections to facilitate maintenance and eventual replacement.

Figure 12:
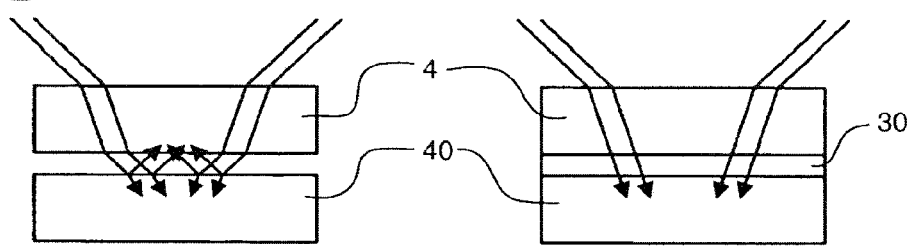
FIG. 12 depicts the use of a filler sheet in a stack comprising a transmissive plate and a photodiode, along with example ray paths.

The path of radiation beams through the above arrangement is illustrated in FIG. 12. The right-hand diagram comprises a filler sheet 30 while, for comparison, the left-hand diagram does not.

FIGS. 13 to 18 depict further embodiments of the invention, wherein light (arrows) propagates from the final element of the projection system PL through the immersion liquid 1 onto the sensor. In FIGS. 13 to 16, components are arranged to remove low refractive index parts from the sensor.

Figure 13:
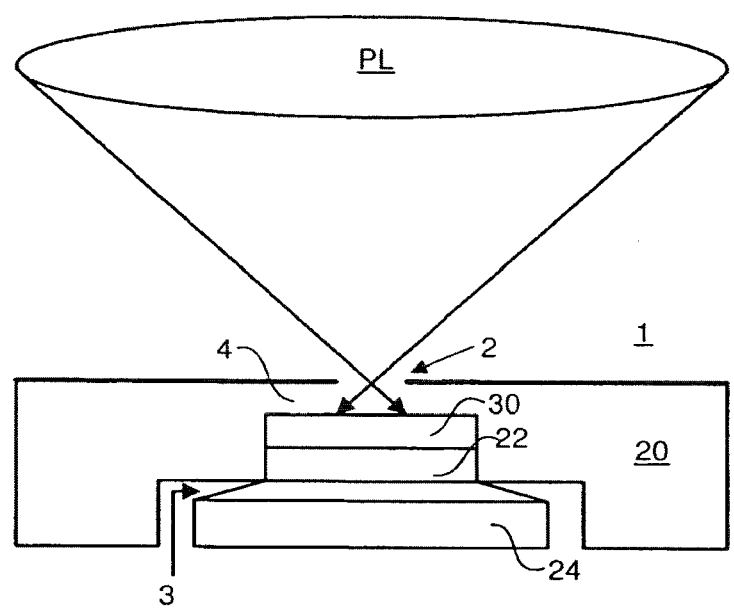
FIG. 13 depicts a sensor at substrate level, comprising a photocell in combination with a luminescence layer, with a filler sheet positioned above the luminescence layer.

In the embodiment according to FIG. 13, the sensor comprises a luminescence layer 22 in combination with a photocell 24. A filler sheet 30 is arranged between the luminescence layer 22 and the radiation receiver 2, in such a way as to avoid interfaces with gas between those elements. The purpose of the filler sheet is to increase the amount of light continuing through to the detector. A gas gap 3 is arranged between the luminescence layer 22 and the photocell 24, which is described below.

Figure 14:
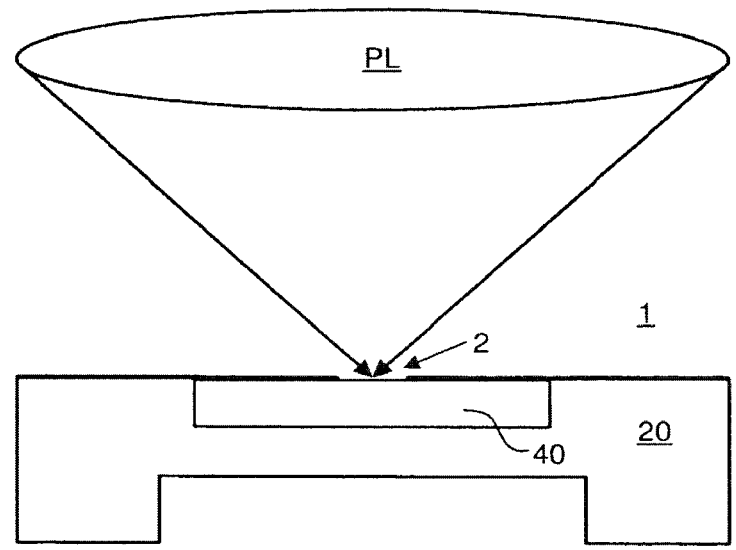
FIG. 14 depicts a sensor at substrate level, comprising a photocell positioned immediately below the radiation receiver.

In the embodiment according to FIG. 14, the sensor comprises a photocell 40, which is arranged to be in contact with the radiation receiver on the opposite side to the projection system. This arrangement avoids all interfaces with gas. Absorption may also be reduced because the radiation does not pass through intermediate layers.

Figure 15:
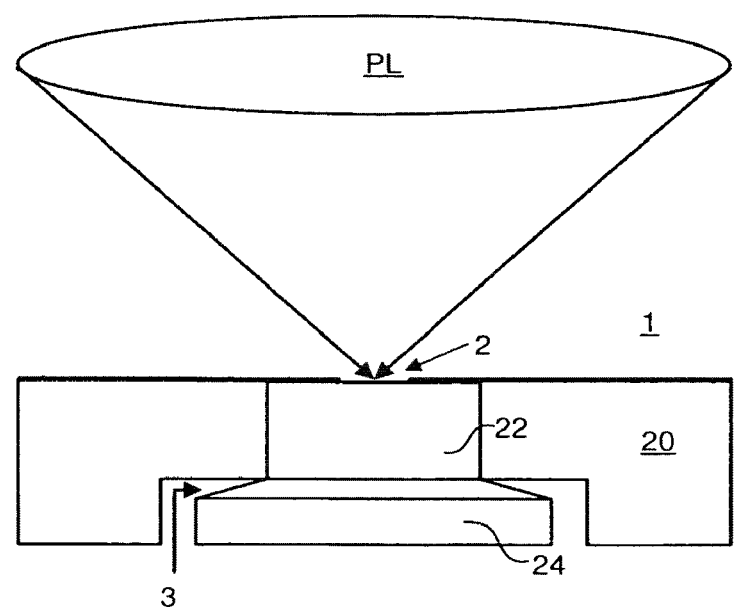
FIG. 15 depicts a sensor at substrate level, comprising a photocell in combination with a luminescence layer positioned immediately below the radiation receiver.

In the embodiment according to FIG. 15, a sensor arrangement analogous to that shown in FIG. 13 is depicted. However, an extended luminescence layer 22 is used to fill the space between the front and rear of the sensor body 20. Interfaces and interface-induced reflections are thereby avoided. A gas gap 3 is arranged between the luminescence layer 22 and the photocell 24, which is described below.

Figure 16:
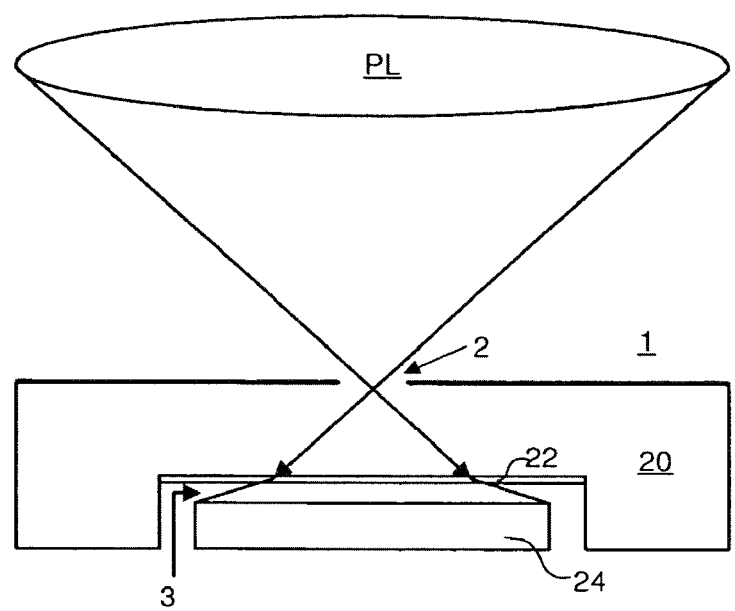
FIG. 16 depicts a sensor at substrate level, comprising a photocell in combination with a luminescence layer positioned immediately below the quartz sensor body.

FIG. 16 depicts a further embodiment of the invention, wherein the sensor arrangement comprises a luminescence layer 22 in combination with a photocell 24. In this case the luminescence layer may take a flattened form and be located on the side of the sensor body 20 facing away from the projection system and in contact with the sensor body 20, thus avoiding interfaces with gas before the luminescence layer. A gas gap 3 is arranged between the luminescence layer 22 and the photocell 24, which is described below.

Figure 17:
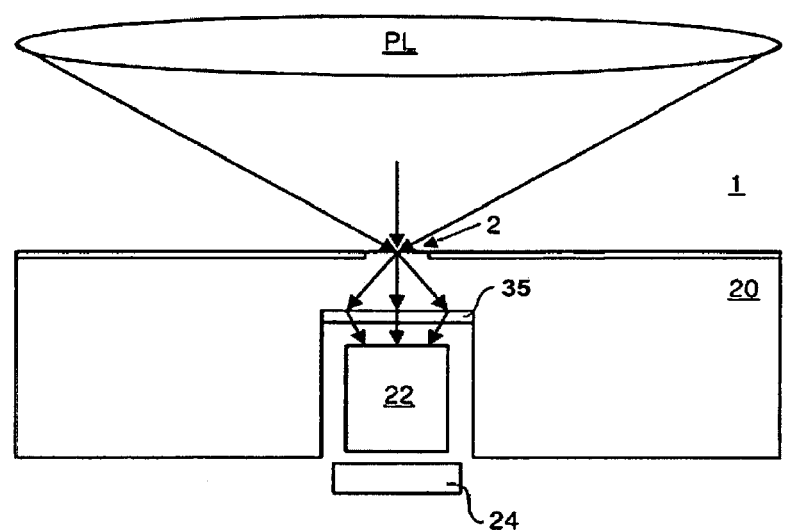
FIG. 17 depicts a sensor at substrate level, comprising a photocell in combination with a luminescence layer and a diffractive lens.
Figure 18:
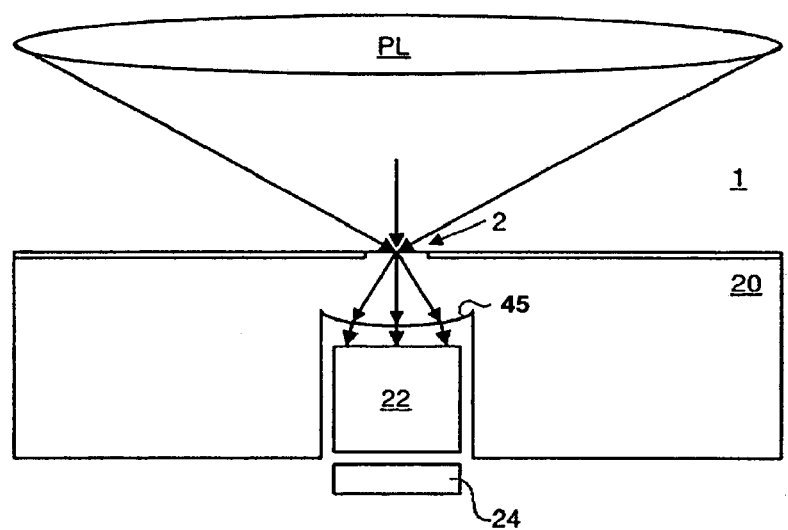
FIG. 18 depicts a sensor at substrate level, comprising a photocell in combination with a luminescence layer and a micro-lens.

FIG. 17 depicts an embodiment that comprises a diffractive lens 35 located between the radiation receiver 2 and the radiation detector 24. The diffractive lens 35 acts to focus the incident radiation by diffraction towards the luminescence material 22, thereby improving the ability of the detector to accept rays that are incident at high angles (such as in systems with high NA). The use of a diffraction-based mechanism allows the lens to be constructed in a miniature form. An alternative and/or additional approach is depicted in FIG. 18, wherein a micro-lens 45 (operating principally by refraction rather than diffraction) is included in an equivalent position to the diffractive lens 35. In the particular arrangement shown, the micro-lens 45 is formed directly from the material of the sensor body 20. This arrangement avoids having to add the lens as a separate component, which increases system complexity, and also avoids the problem of additional signal loss that may occur due to reflection at interfaces with the lens material. However, a different material may also be used for the micro-lens 45 without departing from the scope of the invention.

In embodiments comprising a luminescence layer 22 in combination with a photocell 24, a small gas gap (of the order of microns) may be arranged between the luminescence layer 22 and the photocell 24. The small size of the gap means that even high angle rays that refract to higher angles at the gas interface may still impinge on the photocell without making the photocell overly large. In addition, some proportion of radiation arriving at the gas interface above the critical angle may still propagate to the photocell via tunneling of the evanescent wave across the gas gap. In an embodiment, the size of the gap is smaller than the wavelength of incident radiation.

The radiation receiver may comprise a grating and or an element having a pinhole, depending on the function of the sensor.

The sensors may be located at the level of the substrate and in particular such that the radiation receiver 16 is at substantially the same distance from the final element of the projection system as the substrate W.

In an embodiment, there is provided a lithographic apparatus, comprising: an illumination system configured to condition a radiation beam; a support constructed to hold a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; and a sensor at substrate level comprising a radiation receiver, a transmissive plate supporting the radiation receiver, and a radiation detector, the sensor being arranged to avoid loss of radiation between the radiation receiver and a final element of the radiation detector.

In an embodiment, the sensor comprises a transmissive filler sheet. In an embodiment, the filler sheet is arranged to avoid a gas gap between the radiation receiver and the final element of the radiation detector. In an embodiment, the filler sheet is arranged to be transmissive for the predominant wavelength of radiation passing through it. In an embodiment, the filler sheet is arranged to maximize refractive index matching with surrounding media. In an embodiment, the filler sheet is positioned in contact with an optically rough component interface and treated so as to follow the contour of the surface roughness. In an embodiment, the treatment of the filler sheet comprises deformation by mechanical compression, heating, or both. In an embodiment, the filler sheet has a refractive index equal to or greater than the refractive index of a liquid at least partly filling a space between the projection system and the substrate. In an embodiment, the filler sheet comprises two layers of different refractive indices and a micro-lens array formed at the interface between the two layers. In an embodiment, the transmissive plate is arranged to extend continuously between the radiation receiver and the radiation detector. In an embodiment, an optical component of the sensor comprises an internal-reflection-enhancing layer on its outer lateral surface. In an embodiment, the internal-reflection-enhancing layer comprises a roughened depth of the outer lateral surface in combination with a metal coating. In an embodiment, the radiation detector comprises a photocell or a photocell in combination with a luminescence layer. In an embodiment, the radiation detector comprises a photocell adapted to detect DUV radiation directly. In an embodiment, a gas gap between the radiation receiver and the final component of the radiation detector is of a thickness less than the predominant wavelength of radiation expected to pass through the gas gap. In an embodiment, the radiation receiver is a grating or an element having a pinhole. In an embodiment, the apparatus further comprises a diffractive lens located between the radiation receiver and the radiation detector. In an embodiment, the apparatus further comprises a micro-lens located between the radiation receiver and the radiation detector.

In an embodiment, there is provided a device manufacturing method, comprising: projecting a patterned beam of radiation using a projection system onto a target portion of a substrate; and projecting a beam of radiation onto a sensor at substrate level that receives the beam of radiation via a radiation receiver and detects the beam of radiation via a radiation detector, the sensor being arranged to avoid loss of radiation between the radiation receiver and the final element of the radiation detector.

In an embodiment, the method comprises projecting the beam of radiation through a transmissive filler sheet of the sensor. In an embodiment, the filler sheet is arranged to avoid a gas gap between the radiation receiver and the final element of the radiation detector. In an embodiment, the filler sheet is arranged to maximize refractive index matching with surrounding media. In an embodiment, the method comprises providing a liquid to a space between the projection system and the substrate and wherein the filler sheet has a refractive index equal to or greater than the refractive index of the liquid. In an embodiment, the filler sheet comprises two layers of different refractive indices and a micro-lens array formed at the interface between the two layers. In an embodiment, the method comprises projecting the beam of radiation through a transmissive plate extending continuously between the radiation receiver and the radiation detector. In an embodiment, the method comprises projecting the beam of radiation through an optical component of the sensor, the optical component comprising an internal-reflection-enhancing layer on its outer lateral surface. In an embodiment, the method comprises projecting the beam of radiation through a gas gap between the radiation receiver and the final component of the radiation detector, the gas gap having a thickness less than the predominant wavelength of radiation expected to pass through the gas gap. In an embodiment, the radiation receiver is a grating or an element having a pinhole. In an embodiment, the method comprises projecting the beam of radiation through a diffractive lens or a micro-lens located between the radiation receiver and the radiation detector.

Another solution which has been proposed is to provide the liquid supply system with a seal member which extends along at least a part of a boundary of the space between the final element of the projection system and the substrate table. The seal member is substantially stationary relative to the projection system in the XY plane though there may be some relative movement in the Z direction (in the direction of the optical axis). A seal is formed between the seal member and the surface of the substrate. In an embodiment, the seal is a contactless seal such as a gas seal. Such as system with a gas seal is disclosed in U.S. patent application Ser. No. 10/705,783, hereby incorporated in its entirety by reference.

Figure 4:
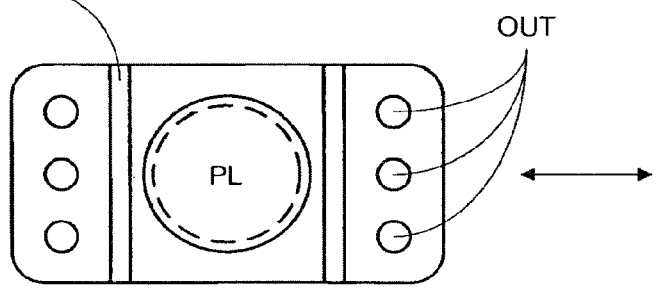
FIG. 4 depicts a another liquid supply system for use in a lithographic projection apparatus.
Figure 4:
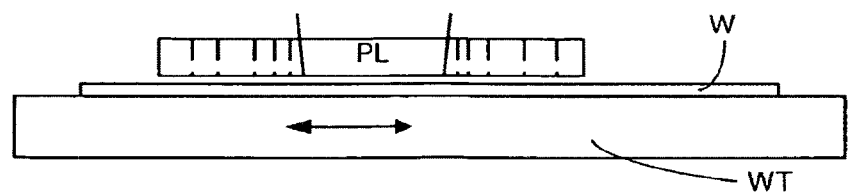

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

In European Patent Application No. 03257072.3, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

The present invention can be applied to any immersion lithography apparatus, in particular, but not exclusively, those types mentioned above.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
a substrate table constructed to hold a substrate;
a projection system configured to project a patterned radiation beam onto a target portion of the substrate;
a liquid supply system configured to provide a liquid to a space between the projection system and the substrate; and
a sensor arranged to receive radiation from the projection system, the sensor comprising:
a radiation detector;
a radiation-shielding member having an aperture; and
a radiation-transmissive body extending from the radiation-shielding member toward the radiation detector, and arranged such that radiation projected by the projection system comes through the aperture and into the body, the body arranged to couple the radiation to the radiation detector,
wherein the radiation detector is blocked from liquid on a side of the radiation-shielding member opposite to the radiation detector, and
wherein there is no substantial gas gap in the path of the radiation between the radiation-shielding member and the radiation detector.

2. The apparatus according to claim 1, wherein the sensor comprises a transmissive filler sheet.

3. The apparatus according to claim 2, wherein the filler sheet is arranged to avoid a gas gap between the radiation-shielding member and the radiation detector.

4. The apparatus according to claim 2, wherein the filler sheet is arranged to maximize refractive index matching with surrounding media.

5. The apparatus according to claim 2, wherein the filler sheet is positioned in contact with an optically rough component interface and arranged so as to follow the contour of the surface roughness.

6. The apparatus according to claim 2, wherein the filler sheet has a refractive index equal to or greater than the refractive index of the liquid.

7. The apparatus according to claim 1, wherein the transmissive body is arranged to extend continuously between the radiation-shielding member and the radiation detector.

8. The apparatus according to claim 1, wherein an optical component of the sensor comprises an internal-reflection-enhancing layer on its outer lateral surface.

9. The apparatus according to claim 8, wherein the internal-reflection-enhancing layer comprises a metal coating.

10. The apparatus according to claim 1, wherein the radiation detector comprises a photocell in combination with a luminescence layer.

11. The apparatus according to claim 1, wherein the radiation detector comprises a photocell adapted to detect DUV radiation directly.

12. The apparatus according to claim 1, wherein the radiation-shielding member comprises a grating or an element having a pinhole.

13. The apparatus according to claim 1, further comprising a diffractive lens located between the radiation-shielding member and the radiation detector.

14. The apparatus according to claim 1, further comprising a micro-lens located between the radiation-shielding member and the radiation detector.

15. The apparatus according to claim 1, further comprising a lens array in the path of the radiation between the aperture and the radiation detector.

16. The apparatus according to claim 1, wherein a gas gap in the path of the radiation between the radiation detector and the radiation-shielding member has a thickness of the order or microns or less.

17. The apparatus according to claim 16, wherein a gas gap in the path of the radiation between the radiation detector and the radiation-shielding member has a thickness less than the predominant wavelength of the radiation expected to pass through the gas gap.

18. A device manufacturing method, comprising:
projecting a patterned beam of radiation, through a liquid, using a projection system onto a target portion of a substrate; and
projecting a beam of radiation onto a sensor from the projection system, the sensor comprising a radiation detector, a radiation-shielding member having an aperture, and a radiation-transmissive body extending from the radiation-shielding member toward the radiation detector, the radiation projected by the projection system coming through the aperture and into the body and the body coupling the radiation to the radiation detector, wherein the radiation detector is blocked from fluid on a side of the radiation-shielding member opposite to the radiation detector, and wherein there is no substantial gas gap in the path of the radiation between the radiation-shielding member and the radiation detector.

19. The method according to claim 18, comprising projecting the beam of radiation through a transmissive filler sheet of the sensor.

20. The method according to claim 18, comprising projecting the beam of radiation through a lens array in the radiation path between the aperture and the radiation detector.

21. A lithographic apparatus, comprising:
a substrate table constructed to hold a substrate;
a projection system configured to project a patterned radiation beam onto a target portion of the substrate;
a liquid supply system configured to provide a liquid to a space between the projection system and the substrate; and
a sensor arranged to receive radiation from the projection system, the sensor comprising:
a radiation detector;
a radiation-transmissive body extending from a radiation-shielding member toward the radiation detector, and arranged such that radiation projected by the projection system is-incident on a surface of the body comes into the body, the body arranged to couple the radiation to the radiation detector; and
a lens array between the surface and the radiation detector, the lens array arranged to couple the radiation to the radiation detector,
wherein the radiation detector is blocked from liquid on a side of the body opposite to the radiation detector, and
wherein there is no substantial gas gap in the path of the radiation between the surface and the lens array.

22. The apparatus according to claim 21, wherein an optical component of the sensor comprises an internal-reflection-enhancing layer on its outer lateral surface.

23. The apparatus according to claim 21, further comprising the radiation-shielding member, the radiation-shielding member having an aperture, wherein the body is wider than the width of the aperture.

24. The apparatus according to claim 21, further comprising a gas gap between the lens array and the radiation detector.

25. The apparatus according to claim 21, wherein the sensor is configured to measure optical aberrations.

26. The apparatus according to claim 21, wherein the sensor is arranged not to include an interface at which total reflection of the radiation along the path between the surface and the radiation detector occurs.

27. The apparatus according to claim 21, wherein a gas gap in the path of the radiation between the radiation-shielding member and the radiation detector has a thickness of the order or microns or less.

28. A device manufacturing method, comprising:
projecting a patterned beam of radiation, through a liquid, using a projection system onto a target portion of a substrate; and
projecting a beam of radiation, through the liquid, onto a sensor from the projection system, the sensor comprising a radiation detector, a radiation-transmissive body extending from a radiation-shielding member toward the radiation detector, wherein the radiation projected by the projection system is incident on a surface of the body, comes into the body, and passes to the radiation detector, and a lens array between the surface and the radiation detector, the lens array coupling the radiation to the radiation detector, wherein the radiation detector is blocked from liquid on a side of the body opposite to the radiation detector, and wherein there is no substantial gas gap in the path of the radiation between the surface and the lens array.

29. The method according to claim 28, wherein there is no gas gap in the path of the radiation between the surface and the lens array.

30. The method according to claim 28, further comprising internally reflecting radiation inside an optical component of the sensor from an outer lateral face of the optical component.

31. A sensor unit, comprising:
a radiation detector;
a radiation-transmissive body extending from a radiation-shielding member toward the radiation detector, and arranged such that radiation incident on a surface of the body comes into the body, the body arranged to couple the radiation to the radiation detector; and
a lens array between the surface and the radiation detector, the lens array arranged to couple the radiation to the radiation detector,
wherein the radiation detector is blocked from liquid on a side of the body opposite to the radiation detector, and wherein there is no substantial gas gap in the path of the radiation between the surface and the lens array.

32. The sensor unit according to claim 31, wherein there is no substantial gas gap in the path of the radiation between the surface and the radiation detector.

33. The sensor unit according to claim 31, wherein an optical component of the sensor unit comprises an internal-reflection-enhancing layer on its outer lateral surface.

34. The sensor unit according to claim 31, wherein a gas gap in the path of the radiation between the surface and the radiation detector has a thickness of the order or microns or less.

35. The sensor unit according to claim 31, wherein the lens array comprises a micro-lens array.

36. The sensor unit according to claim 1, configured to measure optical aberrations.

* * * * *